US005828123A

United States Patent [19]

Hirano

[11] Patent Number: 5,828,123

[45] Date of Patent: Oct. 27, 1998

[54] CHIP RESISTOR AND METHOD FOR PRODUCING SAME

[75] Inventor: Tatsuki Hirano, Zama, Japan

[73] Assignee: Kamaya Electric Co., Ltd., Kanagawa-Ken, Japan

[21] Appl. No.: 769,155

[22] Filed: Dec. 18, 1996

[30] Foreign Application Priority Data

Dec. 21, 1995 [JP] Japan .................................... 7-333755

[51] Int. Cl.[6] ............................. H01L 29/00; H01L 49/02

[52] U.S. Cl. .......................... 257/536; 257/537; 338/328; 427/103

[58] Field of Search ..................................... 257/536, 537; 438/384, 385, 429; 338/327, 328; 427/103; 361/766

[56] References Cited

U.S. PATENT DOCUMENTS 4,842,654 6/1989 Shindo et al. .......................... 148/512

FOREIGN PATENT DOCUMENTS 1-136302 5/1989 Japan .
3-250601 11/1991 Japan .

*Primary Examiner*—John Guay
*Attorney, Agent, or Firm*—Darby & Darby

[57] ABSTRACT

A chip resistor comprising an insulated substrate, a pair of top electrodes disposed on top of said insulated substrate, a resistor film bridging said pair of top electrodes, a protective film coating said resistor film, and an end electrode and a plated electrode film which are formed on each of said pair of top electrodes, wherein each of said top electrodes includes:

a first electrode section connected to said resistor film; and a second electrode section not in direct contact with said resistor film and arranged in connection to and along said first electrode section so as to extend in parallel with a portion of said first electrode section between said resistor film and said end electrode, said second electrode section having a sheet resistivity lower than that of said first electrode section.

3 Claims, No Drawings

CHIP RESISTOR AND METHOD FOR PRODUCING SAME

BACKGROUND OF THE INVENTION

1. Field of the Invention

The present invention relates to a chip resistor and a method for producing the chip resistor, and more particularly to a chip resistor having a lowered resistivity and a method for producing the chip resistor with lowered resistivity.

2. Prior Art

Hitherto known as a chip resistor is generally one of a type including an insulated substrate, a pair of top electrodes disposed on top of the insulated substrate, a resistor film formed in such a manner as to bridge the pair of top electrodes, a protective film coating the resistor film, and an end electrode and a plated electrode film which are formed on each of the top electrodes. The top electrodes are formed of, for example, an Ag/Pd glaze material. In the case of employing the Ag/Pd glaze material as the top electrode material, the content of Ag therein is large due to its low cost. More specifically, it is prevalent to employ as the top electrode material an Ag/Pd glaze material having Ag content of not less than 95 wt % and Pd content of not more than 5 wt % in the Ag/Pd mixing ratio.

However, the conventional top electrode formed of, e.g., the Ag/Pd glaze material is apt to suffer from an inconvenience that the resistance value of the top electrode itself may exceed that of the resistor film, with the result that the resistance value of the chip resistor is substantially determined by the resistance value of the top electrode.

As can be seen from the Ag/Pd mixing ratio described above, the conventional top electrode contains as much as 95 wt % of Ag, and hence upon printing and firing the resistor film, Ag may easily diffuse into the resistor film connected to the top electrode, which results in a deterioration in electric properties of the resistor film. As one of the index for such electric properties, ESD (Electro-Static Discharge) test characteristics are known, but the rate-of-change in resistance value thereof was also poor.

In addition, due to use of expensive special glass material in the conventional top electrode, in view of resistance to plating chemicals, the cost of the chip resistors to be manufactured is increased.

SUMMARY OF THE INVENTION

In view of the above problems involved in the prior art techniques, the present invention aims to solve the deficiencies. It is therefore an object of the present invention to provide a chip resistor wherein the resistance value of the top electrode is lowered to thereby alleviate any degradation which the resistor film may suffer, without impeding good characteristics which have hitherto been acquired.

Another object of the present invention is to provide a chip resistor wherein the electric properties (ESD test characteristic, etc.) of the resistor film is prevented from being deteriorated even in the case of containing Ag in the top electrode material, and wherein the resistance to plating chemicals is ensured without a need to employ any special glass material, to thereby realize a reduction in price of the chip resistor to be manufactured.

A further object of the present invention is to provide a chip resistor which can be manufactured at a further reduced cost.

A still another object of the present invention is to provide a method for producing a chip resistor allowing the resistivity of the chip resistor electrodes to be lowered.

The present invention was conceived in order to achieve the above objects. Its subject matter lies in a chip resistor that follows.

According to the present invention, there is provided a chip resistor comprising an insulated substrate, a pair of top electrodes disposed on top of said insulated substrate, a resistor film bridging said pair of top electrodes, a protective film coating said resistor film, and an end electrode and a plated electrode film which are formed on each of said pair of top electrodes, wherein each of said top electrodes includes:

- a first electrode section connected to said resistor film; and
- a second electrode section not in direct contact with said resistor film and arranged in connection to and along said first electrode section so as to extend in parallel with a portion of said first electrode section between said resistor film and said end electrode, said second electrode section having a sheet resistivity lower than that of said first electrode section. According to this aspect, a configuration is employed in which the second electrode section is arranged in connection to the first electrode section as described above, thereby obviating the first electrode section corresponding to the conventional top electrode, allowing the second electrode section having a lower sheet resistivity to serve as an electrically conductive path. It is thus possible to lower the resistivity of the top electrode without impeding the various performances which have been hitherto acquired and to lessen the inconveniences that the resistor film may suffer from.

According to the present invention, there is also provided a chip resistor of the above type, wherein said first electrode section is formed of an Ag/Pd glaze material having Ag content of not more than 85% by weight and Pd content of not less than 15% by weight in the Ag/Pd mixing ratio. According to this aspect, the Ag/Pd glaze material is used for forming the first electrode section and Ag glaze material is used for forming the second electrode section as described above, thereby reducing the amount of Ag which may diffuse into the resistor film upon printing and firing the resistor film, even in the case where Ag is contained in the material of the top electrode. It is thus possible to prevent the electrical properties (such as ESD test characteristic) from being deteriorated and to ensure resistance to plating chemicals without a need to employ any special glass material, which features contribute to a reduction in price of chip resistors to be manufactured.

According to the present invention, there is also provided a chip resistor of the above type, wherein said second electrode section is formed of an Ag glaze material. According to this aspect, it is possible to achieve a further reduction in price of chip resistors to be manufactured.

According to the present invention, there is also provided a method for producing a chip resistor comprising an insulated substrate, a pair of top electrodes disposed on top of said insulated substrate, a resistor film bridging said pair of top electrodes, a protective film coating said resistor film, and an end electrode and a plated electrode film which are formed on each of said pair of top electrodes, each of said top electrodes including a first electrode section connected to said resistor film, and a second electrode section not in direct contact with said resistor film and arranged in connection to and along said first electrode section so as to extend in parallel with a portion of said first electrode section between said resistor film and said end electrode, said second electrode section having a sheet resistivity lower than that of said first electrode section, said method comprising the steps of:

firing said first electrode section at a predetermined firing temperature; and firing thereafter said second electrode section at a firing temperature lower than that for said first electrode section. According to this aspect of the present invention, the firing temperature for the second electrode section is set to be lower than that for the first electrode section which is formed previous to the formation of the second electrode section, thereby enabling the second electrode section to be formed without deteriorating the performances of the first electrode section in printing and firing the second electrode section.

According to the present invention, there is also provided a method for producing a chip resistor as mentioned above, wherein said first electrode section is formed of an Ag/Pd glaze material having Ag content of not more than 85% by weight and Pd content of not less than 15% by weight in the Ag/Pd mixing ratio. According to this aspect, it is possible to reduce the amount of Ag which may diffuse into the resistor film upon printing and firing the resistor film, even in the case where Ag is contained in the material of the top electrode. It is also possible to prevent the electrical properties (such as ESD test characteristic) from being deteriorated and to ensure resistance to plating chemicals without a need to employ any special glass material, which will contribute to a reduction in price of chip resistors to be manufactured.

According to the present invention, there is also provided a method for producing a chip resistor as mentioned above, wherein said second electrode section is formed of an Ag glaze material. The second electrode section is an Ag glaze material. According to this aspect, it is possible to achieve a further reduction in price of chip resistors to be manufactured.

In this specification, the resistance to plating chemicals means a resistance to plating by use of electroplating solution, such as, for example, nickel plating solution or a solder plating solution. The index thereof can be uniformity of the plated electrode film, which depends on the relationship between a composition of the electrically conductive powder such as Ag/Pd and a glass component, and an adhesion of the plated electrode film. The ESD test characteristic means a rate-of-change in resistance value prior to and after a test in which a capacitor is charged with a high voltage, with a chip resister being inserted into its discharge side for discharge. An index thereof can be a rate-of-change in resistance value (%) which depends on an effective area of the resistor film, its trimmed shape, and a material of the resistor.

In the chip resistor according to the present invention, the first electrode section constituting the top electrode can be formed of any suitable materials including an Ag/Pd paste having Pd content of 15%, 20% or 22% in the Ag/Pd mixing ratio, a gold paste, a platinum paste, a platinum alloy paste, or glaze materials thereof. It is to be appreciated that the smaller the sheet resistivity of the first and the second electrode sections and the sheet resistivity of the resistor film the better, and that this is a priority condition. It should also be understood that the larger the difference in sheet resistivities between the first and the second electrode sections, the better within a range of sheet resistivity permissible to the top electrode, that is, within a permissible range, for example, below the sheet resistivity of the resistor film.

If, in particular, the first electrode section is formed of an Ag/Pd glaze material having Ag content of not more than 85% by weight and Pd content of not less than 15% by weight in the Ag/Pd mixing ratio, the amount of Ag is reduced which may diffuse into the resistor film upon printing and firing the resistor film, even in the case where Ag is contained in the material of the top electrode. It is thus possible to prevent deterioration of the resistor film electrical properties and to eliminate the necessity to use a special glass material, thereby accomplishing reduction in price of the chip resistors to be manufactured. Forming the second electrode section of a less expensive Ag glaze material would lead to a manufacture of the chip resistor at a further reduced cost.

If the first electrode section is formed in the form of a thin or a thick film made of gold and the second electrode section is formed in the form of an Ag glaze film made of Ag glaze paste, a suppressed diffusion of gold from the first electrode section will be achieved when the resistor film is for example RuO2 based, which results in other advantageous effects such as avoiding deterioration in the various characteristics.

If the first electrode section is formed in the form of a thin or a thick film made of platinum or its alloy and the second electrode section is formed in the form of an Ag glaze film made of Ag glaze paste, a diffusion from the first electrode section will similarly be suppressed when the resistor film is for example $RuO_2$ based, which results in other advantageous effects such as avoiding deterioration in the various characteristics.

In the chip resistor of the present invention, the second electrode section is so arranged so as not to come into direct contact with the resistor film, to thereby prevent any adverse effect on the resistor film in printing and firing as well as any deterioration in adhesion between the second electrode section and the resistor film.

DESCRIPTION OF THE PREFERRED EMBODIMENTS

The present invention will now be described by way of Examples. It is to be naturally appreciated that the invention is not intended to be limited to the specified embodiment.

A chip resistor in accordance with the present invention includes an insulated substrate, a pair of top electrodes disposed on top of the insulated substrate, a trimmed 0.1Ω resistor film (for example, Pd/Ag glaze paste) bridging the top electrodes, a protective film coating the resistor film (for example, lead borosilicate glass), and an end electrode and a plated electrode film which are formed on each of the top electrodes. Each of the top electrodes includes a first electrode section (for example, Ag/Pd glaze material) having a sheet resistivity of 20 m Ω/□ connected to the resistor film, and a second electrode section (for example, Ag glaze material) having a sheet resistivity of 1 m Ω/□ that is not in direct contact with the resistor film and arranged in connection to and along the first electrode section so as to extend in parallel with a portion of the first electrode section between the resistor film and the end electrode. The sheet resistivity of each top electrode is set to be lower than that of the resistor film.

Here, the Ag/Pd glaze material of the first electrode section has an Ag content of not more than 85% by weight and Pd content of not less than 15% by weight in the Ag/Pd mixing ratio, and the first electrode section is fired at 850° C. The second electrode section is formed of the Ag glaze material, and fired at 600° C. The firing temperature for the second electrode section is set to be lower than that for the first electrode section so that Ag in the Ag glaze material is not allowed to diffuse into the first electrode section upon printing and firing the second electrode section.

In the above embodiment, the sheet resistivity of the second electrode section is set to be lower than that of the first electrode section which corresponds to the conventional top electrode, thereby making it possible to lower the resistivity of the electrode itself. Compared with a single top electrode containing as much as 95 wt % or more Ag as set forth in the prior art description, the Ag content is reduced so as to diminish the diffusion of Ag into the resistor film. In addition, without using any special glass in view of resistance to plating chemicals, there can be achieved an improvement in resistance to plating chemicals and in the ESD test characteristic, with an advantageous effect in curtailing the production costs of the chip resistor itself. More specifically, in the prior art top electrode, the plated electrode film is uneven which provides an index of the resistance to plating chemicals, the adhesion is poor, and the rate-of-change in resistance value is of the order of 0 to −6% which provides an index of the ESD test characteristic. On the contrary, in the top electrode of the present invention, the plated electrode film which is an index of the resistance to plating chemicals, is even without causing the adhesion to lower, and the rate-of-change in resistance value which is an index of the ESD test characteristic, was of the order of 0 to −1.0%.

Any other appropriate materials than the above are available for the first electrode section, with Ag content being preferably not more than 85 wt %, and it would also be preferred to use other metal paste materials or other metallic glaze materials such as gold, platinum or platinum alloy containing Ag by no means. Available for the other materials for the second electrode section are for example a paste of silver having a lower sheet resistivity.

In the case of employing the Ag/Pd glaze material as the material for the first electrode section, it would be preferable in the present invention that the Ag content be not more than 85 wt % in the Ag/Pd mixing ratio. According to this embodiment, as compared with a case of Ag content exceeding 85 wt % in the Ag/Pd mixing ratio, there can be achieved an even plating electrode film for the resistance to plating chemicals, without causing the adhesion to lower, and a good rate-of-change in resistance value improved by −0.5% for the ESD test characteristic.

Although the present invention has been described with reference to the preferred embodiments, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A chip resistor comprising an insulated substrate, a pair of top electrodes disposed on said insulated substrate, a resistor film bridging said pair of top electrodes, a protective film coating said resistor film, and an end electrode and a plated electrode film on each of said pair of top electrodes, wherein each of said top electrodes comprises:

a first electrode section formed of an Ag/Pd glaze material having Ag content of not more than 85% by weight and Pd content of not less than 15% by weight in the Ag/Pd mixing ratio connected to said resistor film; and a second electrode section not in direct contact with said resistor film and arranged connected to and along said first electrode section and extending in parallel with a portion of said first electrode section between said resistor film and said end electrode, said second electrode section having a sheet resistivity lower than the sheet resistivity of said first electrode section.

2. The chip resistor according to claim 1, wherein said second electrode section is formed of an Ag glaze material.

3. A chip resistor comprising an insulated substrate, a pair of top electrodes disposed on said insulated substrate, a resistor film bridging said pair of top electrodes, a protective film coating said resistor film, and an end electrode and a plated electrode film on each of said pair of top electrodes, wherein each of said top electrodes comprises:

a first electrode section containing a highly conductive metal selected from the group consisting of silver, gold and platinum connected to said resistor film; and a second electrode section containing a highly conductive metal selected from the group consisting of silver, gold and platinum not in direct contact with said resistor film and arranged connected to and along said first electrode section and extending in parallel with a portion of said first electrode section between said resistor film and said end electrode, said second electrode section having a sheet resistivity lower than the sheet resistivity of said first electrode section.

* * * * *